(12) United States Patent
Lee et al.

(10) Patent No.: US 10,114,422 B2
(45) Date of Patent: Oct. 30, 2018

(54) COVER PANEL AND DISPLAY DEVICE INCLUDING THE SAME

(71) Applicant: SAMSUNG DISPLAY CO., LTD., Yongin-si, Gyeonggi-do (KR)

(72) Inventors: Seung Chan Lee, Hwaseong-si (KR); Jong Deok Park, Seoul (KR); Byung Wook Ahn, Seoul (KR); Ki Kyung Youk, Bucheon-si (KR); Jee Hun Lim, Seongnam-si (KR); Suk Won Jung, Cheonan-si (KR); Won Joon Choi, Yongin-si (KR); Jeong Ho Hwang, Cheonan-si (KR)

(73) Assignee: SAMSUNG DISPLAY CO., LTD., Yongin-si, Gyeonggi-do (KR)

(*) Notice: Subject to any disclaimer, the term of this patent is extended or adjusted under 35 U.S.C. 154(b) by 0 days.

(21) Appl. No.: 15/679,503

(22) Filed: Aug. 17, 2017

(65) Prior Publication Data

US 2018/0074556 A1    Mar. 15, 2018

(30) Foreign Application Priority Data

Sep. 9, 2016 (KR) .................. 10-2016-0116749

(51) Int. Cl.
| | |
|---|---|
| *G02F 1/13* | (2006.01) |
| *G06F 1/16* | (2006.01) |
| *G06F 3/041* | (2006.01) |
| *H05K 7/20* | (2006.01) |
| *H05K 9/00* | (2006.01) |

(52) U.S. Cl.
CPC .............. *G06F 1/1656* (2013.01); *G02F 1/13* (2013.01); *G06F 1/1601* (2013.01); *G06F 1/1652* (2013.01); *G06F 3/041* (2013.01); *H05K 7/20963* (2013.01); *H05K 9/0054* (2013.01); *G06F 2203/04102* (2013.01)

(58) Field of Classification Search
None
See application file for complete search history.

(56) References Cited

U.S. PATENT DOCUMENTS

| | | | | |
|---|---|---|---|---|
| 5,971,566 A * | 10/1999 | Tani | ................... | H05K 7/20972 313/46 |
| 7,161,809 B2 * | 1/2007 | Ford | ....................... | G06F 1/203 165/185 |
| 7,235,922 B2 * | 6/2007 | Jun | .................... | H05K 7/20963 313/582 |
| 7,306,847 B2 * | 12/2007 | Capp | ....................... | H05K 5/02 165/185 |
| 7,323,808 B2 * | 1/2008 | Kim | .................... | H05K 7/20963 313/44 |
| 7,486,517 B2 * | 2/2009 | Aapro | .................. | H04M 1/026 165/104.33 |
| 7,679,285 B2 * | 3/2010 | Kim | .................... | H05K 7/20963 313/45 |

(Continued)

FOREIGN PATENT DOCUMENTS

JP    2005-091761 A    4/2005

*Primary Examiner* — Xanthia C Cunningham
(74) *Attorney, Agent, or Firm* — Lee & Morse, P.C.

(57) ABSTRACT

A cover panel and a display device, the cover panel including a heat sink layer; an impact absorbing layer on the heat sink layer; and an elastic pattern on at least one side of the impact absorbing layer.

20 Claims, 9 Drawing Sheets

(56) References Cited

U.S. PATENT DOCUMENTS

| | | | | |
|---|---|---|---|---|
| 8,736,788 B2* | 5/2014 | Kim | .................... | G02B 6/0055 |
| | | | | 349/161 |
| 8,955,580 B2* | 2/2015 | Chen | ........................ | F28F 7/00 |
| | | | | 165/133 |
| 9,082,998 B2* | 7/2015 | Lee | .................... | H01L 27/3244 |
| 9,196,862 B2* | 11/2015 | Huang | ................ | H01L 51/5237 |
| 9,287,916 B2* | 3/2016 | Wicks | .................. | H04B 1/3888 |
| 2006/0290875 A1* | 12/2006 | Shives | .............. | G02F 1/133308 |
| | | | | 349/161 |
| 2006/0292461 A1* | 12/2006 | Shives | .............. | G02F 1/133385 |
| | | | | 430/7 |
| 2010/0245221 A1* | 9/2010 | Khan | .................. | G02F 1/13476 |
| | | | | 345/87 |
| 2013/0100374 A1* | 4/2013 | Kang | .................. | G02B 6/0085 |
| | | | | 349/58 |
| 2014/0376191 A1* | 12/2014 | Hwang | ................ | F28F 13/003 |
| | | | | 361/720 |
| 2015/0086763 A1* | 3/2015 | Nam | .................... | H01L 51/524 |
| | | | | 428/212 |
| 2015/0108530 A1* | 4/2015 | Roberts | ................ | H05K 1/189 |
| | | | | 257/99 |
| 2016/0114568 A1 | 4/2016 | Sher et al. | | |
| 2016/0116798 A1* | 4/2016 | Nam | ................ | G02F 1/133528 |
| | | | | 349/42 |
| 2017/0371197 A1* | 12/2017 | Hirabayashi | ......... | G02B 6/0055 |

* cited by examiner

COVER PANEL AND DISPLAY DEVICE INCLUDING THE SAME

CROSS-REFERENCE TO RELATED APPLICATION

Korean Patent Application No. 10-2016-0116749, filed on Sep. 9, 2016, in the Korean Intellectual Property Office, and entitled: "Cover Panel and Display Device Including the Same," is incorporated by reference herein in its entirety.

BACKGROUND

1. Field

Embodiments relate to a cover panel and a display device including the cover panel.

2. Description of the Related Art

The importance of display devices has steadily grown with developments in multimedia technology. As a result, various display devices such as a liquid crystal display (LCD), an organic light-emitting display, and the like have been developed and widespread.

SUMMARY

Embodiments are directed to a cover panel and a display device including the cover panel.

The embodiments may be realized by providing a cover panel including a heat sink layer; an impact absorbing layer on the heat sink layer; and an elastic pattern on at least one side of the impact absorbing layer.

The elastic pattern may include a urethane, a rubber, or a synthetic resin.

The elastic pattern may have a higher level of elasticity than the impact absorbing layer.

The cover panel may further include an adhesive layer on the elastic pattern and the impact absorbing layer.

A sidewall of the elastic pattern is aligned with a sidewall of the impact absorbing layer.

The elastic pattern may at least partially protrude beyond an edge of the impact absorbing layer in response to pressure being applied to the elastic pattern.

The cover panel may have two long sides opposite to each other, and short sides between the two long sides.

The elastic pattern may extend along one of the short sides.

The cover panel may have corners where the long sides and the short sides meet, and the elastic pattern may be at one of the corners.

An end of the elastic pattern may be beyond an outer edge of the impact absorbing layer.

The embodiments may be realized by providing a display device including a cover panel; and a display panel on the cover panel, wherein the cover panel includes a heat sink layer, an impact absorbing layer on the heat sink layer, and an elastic pattern on at least one side of the impact absorbing layer.

The elastic pattern may include a urethane, a rubber, or a synthetic resin.

The elastic pattern may have a higher level of elasticity than the impact absorbing layer.

A sidewall of the elastic pattern is aligned with a sidewall of the impact absorbing layer.

The elastic pattern may at least partially protrude beyond an edge of the impact absorbing layer in response to pressure being applied to the elastic pattern.

The cover panel may have two long sides opposite to each other, and short sides between the two long sides.

The elastic pattern may extend along one of the short sides.

The cover panel may have corners where the long sides and the short sides meet, and the elastic pattern may be at one of the corners.

An end of the elastic pattern may be beyond an outer edge of the impact absorbing layer.

The display device may further include a touch unit on the display panel; and a window on the touch unit.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
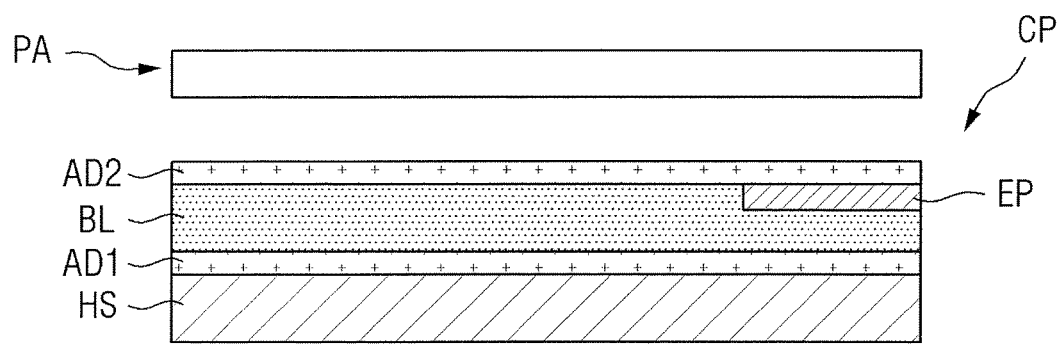
FIG. 1 illustrates a cross-sectional view of a display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration.

The term "on" that is used to designate that an element is on another element or located on a different layer or a layer includes both a case where an element is located directly on another element or a layer and a case where an element is located on another element via another layer or still another element. As used herein, the term "or" is not an exclusive term, i.e., "A or B" would include A, B, and A and B. In the entire specification, the same drawing reference numerals are used for the same elements across various figures.

Although the terms first, second, and the like are used to describe diverse constituent elements, such constituent elements are not limited by the terms. The terms are used only to discriminate a constituent element from other constituent elements. Accordingly, in the following description, a first constituent element may be a second constituent element.

Hereinafter, embodiments will be described with reference to the attached drawings.

Figure 2:
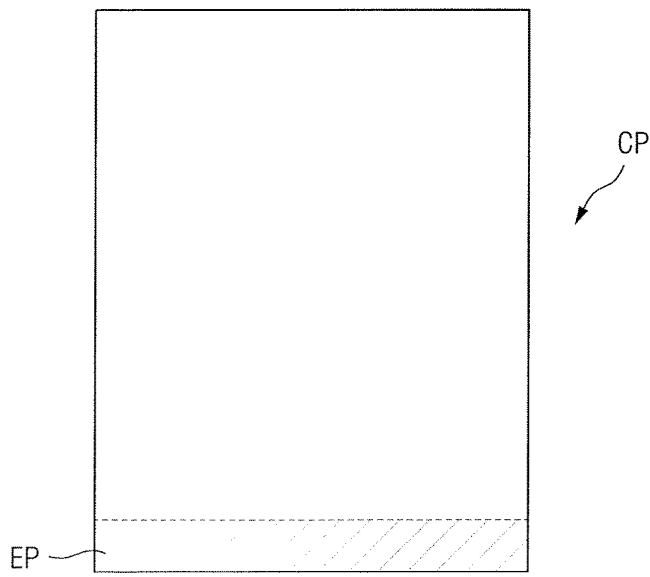
FIG. 2 illustrates a layout view of the display device according to the exemplary embodiment of FIG. 1.

FIG. 1 illustrates a cross-sectional view of a display device according to an exemplary embodiment of the present disclosure. FIG. 2 illustrates a layout view of the display device according to the exemplary embodiment of FIG. 1.

Referring to FIGS. 1 and 2, the display device according to the present exemplary embodiment may include, e.g., a cover panel CP. The cover panel CP may include, e.g., a heat sink layer HS, an impact absorbing layer BL on the heat sink layer HS, and an elastic pattern EP on at least one side of the impact absorbing layer BL.

The heat sink layer HS may be a layer dissipating heat generated in a panel PA (e.g., display panel) that will be described below, and may be formed as a thin plate.

In an implementation, as illustrated in FIG. 1, the heat sink layer HS may be formed as a single layer, or the heat sink layer HS may have a stack structure in which a plurality of functional layers are stacked.

A first adhesive layer AD1 may be on the heat sink layer HS. In an implementation, the first adhesive layer AD1 may be between the heat sink layer HS and the impact absorbing layer BL.

The first adhesive layer AD1 may include, e.g., a photo-curing resin or a thermosetting resin having a high transmittance and having adhesive performance. For example, the first adhesive layer AD1 may be formed by applying a resin such as an acrylic resin and irradiating ultraviolet (UV) light to cure the resin.

For example, the first adhesive layer AD1 may include a pressure sensitive adhesive (PSA).

In an implementation, the first adhesive layer AD1 may include an optically clear adhesive (OCA).

For example, the first adhesive layer AD1 may have a thickness of 5 μm to 200 μm.

The impact absorbing layer BL may be on the first adhesive layer AD1. The impact absorbing layer BL may absorb physical impact applied to the panel PA that will be described below.

The impact absorbing layer BL may employ or include a material or structure capable of absorbing impact.

In an implementation, as illustrated in FIG. 1, the impact absorbing layer BL may be formed as a single layer, or the impact absorbing layer BL may be formed as a stack of a plurality of functional layers, and the plurality of functional layers may include an adhesive layer.

For example, the impact absorbing layer BL may have elasticity. In an implementation, the impact absorbing layer BL may include e.g., a urethane, a rubber, or a synthetic resin.

The elastic pattern EP may be on one side of the impact absorbing layer BL. The elastic pattern EP may at least partially overlap the impact absorbing layer BL. For example, a sidewall of the elastic pattern EP may be aligned with (e.g., coplanar with) a sidewall of the impact absorbing layer BL. For example, an outer sidewall of the elastic pattern EP may be aligned with an outer sidewall of the impact absorbing layer BL.

The elastic pattern EP may be different and/or distinct from the impact absorbing layer BL. The elastic pattern EP may have elasticity. The elastic pattern EP may be formed of a material having elasticity. In an implementation, the elastic pattern EP may include, e.g., a urethane, a rubber, a synthetic resin, or a hydrocarbon compound.

The impact absorbing layer BL and the elastic pattern EP may both have elasticity. In an implementation, the impact absorbing layer BL and the elastic pattern EP may have different levels of elasticity from each other. In an implementation, the elastic pattern EP may have a higher level of elasticity than the impact absorbing layer BL. For example, when a given force is applied to both the elastic pattern EP and the impact absorbing layer BL, an amount of deformation of the elastic pattern EP may be larger than the amount of deformation of the impact absorbing layer BL.

For example, the elastic pattern EP may have a thickness of 10 μm to 300 μm.

A second adhesive layer AD2 may be disposed on the elastic pattern EP and the impact absorbing layer BL. For example, top surfaces of the elastic pattern EP and the impact absorbing layer BL may contact the second adhesive layer AD2.

The second adhesive layer AD2 may include a photo-curing resin or a thermosetting resin having a high transmittance and having adhesive performance. For example, the second adhesive layer AD2 may be formed by applying a resin such as an acrylic resin and irradiating UV light to cure the resin.

For example, the second adhesive layer AD2 may include a PSA.

In another example, the second adhesive layer AD2 may include an OCA.

For example, the second adhesive layer AD2 may have a thickness of 5 μm to 200 μm.

The panel PA may be disposed on the second adhesive layer AD2. In an implementation, the panel PA may include, e.g., a display panel, a touch screen panel (TSP), a touch unit, or a window.

For example, the cover panel CP and the panel PA may form the display device according to the present exemplary embodiment, and this will hereinafter be described later in detail.

Figure 3:
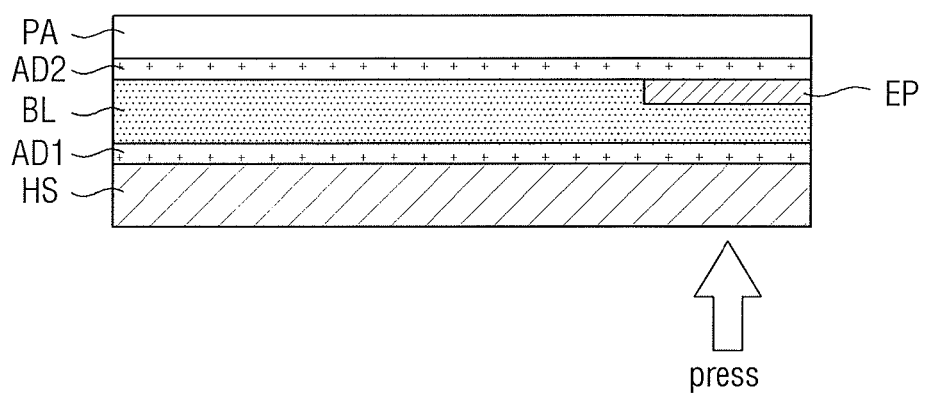
FIG. 3 illustrates a modified cross-sectional view of the display device according to the exemplary embodiment of FIG. 1.

For convenience, the panel PA and the second adhesive layer AD2 are illustrated in FIG. 1 as being separated from each other, but may be placed in direct contact with each other (e.g., as shown in FIG. 3).

A planar shape of the elastic pattern EP will hereinafter be described with reference to FIG. 2.

Referring to FIG. 2, the elastic pattern EP may extend along one side of the cover panel CP.

For example, the cover panel CP may include two long sides, which are opposite to each other, and two short sides, which extend between (e.g., connect) the two long sides.

In an implementation, the elastic pattern EP may extend along one of the short sides of the cover panel CP.

In an implementation, as illustrated in FIG. 2, the elastic pattern EP may extend continuously along one of the short sides of the cover panel CP, or the elastic pattern EP may extend intermittently (e.g., discontinuously) along one of the short sides of the cover panel CP. In an implementation, the elastic pattern EP may extend along an outer edge of the cover panel CP.

The functions of the display device according to the present exemplary embodiment will hereinafter be described with reference to FIGS. 3 through 5.

Figure 4:
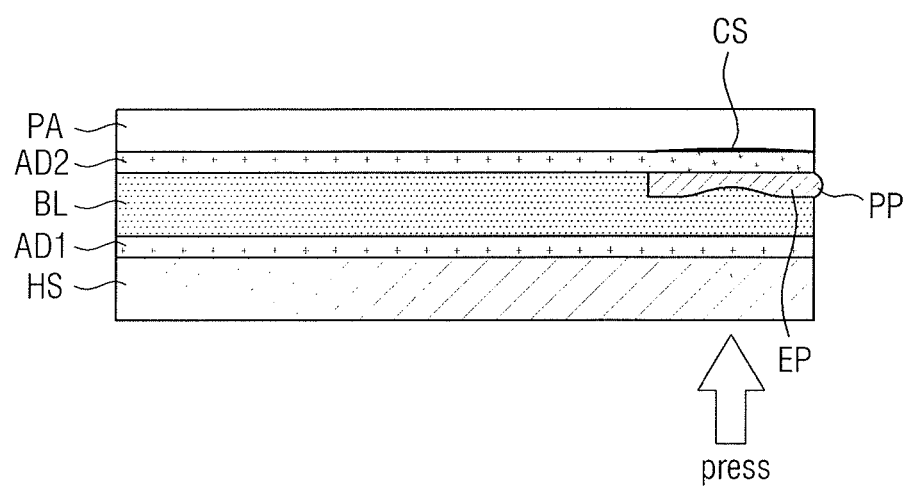
FIG. 4 illustrates a modified cross-sectional view of the display device according to the exemplary embodiment of FIG. 1.
Figure 5:
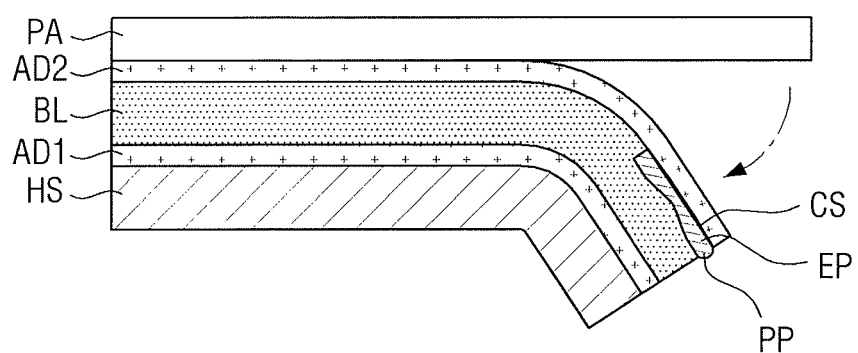
FIG. 5 illustrates a modified cross-sectional view of the display device according to the exemplary embodiment of FIG. 1.

FIGS. 3 through 5 illustrate modified cross-sectional views of the display device according to the exemplary embodiment of FIG. 1.

Referring to FIG. 3, pressure may be applied to the elastic pattern EP by pressing one side of the display device according to the present exemplary embodiment, i.e., the side where the elastic pattern EP is formed.

Referring to FIG. 4, in response to the pressure being applied to the elastic pattern EP, the elastic pattern EP may be at least partially stretched or deformed due to its flexibility.

As a result, the thickness of the elastic pattern EP may become irregular, and the width of the elastic pattern EP may increase.

The stretched part of the elastic pattern EP may form a protrusion PP on one side of the display device according to the present exemplary embodiment.

The second adhesive layer AD2, which is on the elastic pattern EP, may receive uneven pressure due to the presence of the elastic pattern EP. As a result, cracks may be formed in the second adhesive layer AD2. For example, the adhesive performance of the second adhesive layer AD2, which contacts the elastic pattern EP, may deteriorate.

For example, the adhesive force between the second adhesive layer AD2 and the panel PA may deteriorate at a contact surface CS (e.g., overlapping, overlying, or otherwise at least partially aligned with) the elastic pattern EP, among contact surfaces between the second adhesive layer AD2 and the panel PA.

For example, referring to FIG. 5, the panel PA and the cover panel CP may become at least partially detached from each other, and the detachment of the panel PA and the cover panel CP may begin at a particular location in the display device according to the present exemplary embodiment.

If the protrusion PP is formed on one side of the display device according to the present exemplary embodiment or if the adhesive force at the contact surface CS is weakened, the detachment of the panel PA and the cover panel CP may be facilitated.

For example, damage to the display device according to the present exemplary embodiment may be prevented by facilitating the separation of the panel PA and the cover panel CP at the location where the detachment of the panel PA and the cover panel CP begins. For example, the protrusion PP may provide a handle for peeling equipment. For example, the peeling equipment may facilitate the detachment of the panel PA and the cover panel CP by holding the elastic pattern protrusion PP to lift the cover panel CP.

In an implementation, the panel PA and the cover panel CP may be detached from each other with the use or application of a smaller force by at least partially weakening the adhesive force of the second adhesive layer AD2.

In a case in which defects are detected during, or after, the fabrication of the display device according to the present exemplary embodiment, the panel PA may need to be reused. To reuse the panel PA, the cover panel CP may be separated from the panel PA. Without the elastic pattern EP, the adhesive force between the cover panel CP and the panel PA could be strong, and the panel PA could be damaged or broken during the separation of the panel PA and the cover panel CP.

According to an embodiment, the elastic pattern EP may be included in the cover panel CP, the force applied to the panel PA during the separation of the panel PA and the cover panel CP may be reduced, and damage to or breakage of the panel PA may be prevented during the separation of the panel PA and the cover panel CP.

Display devices according to other exemplary embodiments of the present disclosure will hereinafter be described.

Figure 6:
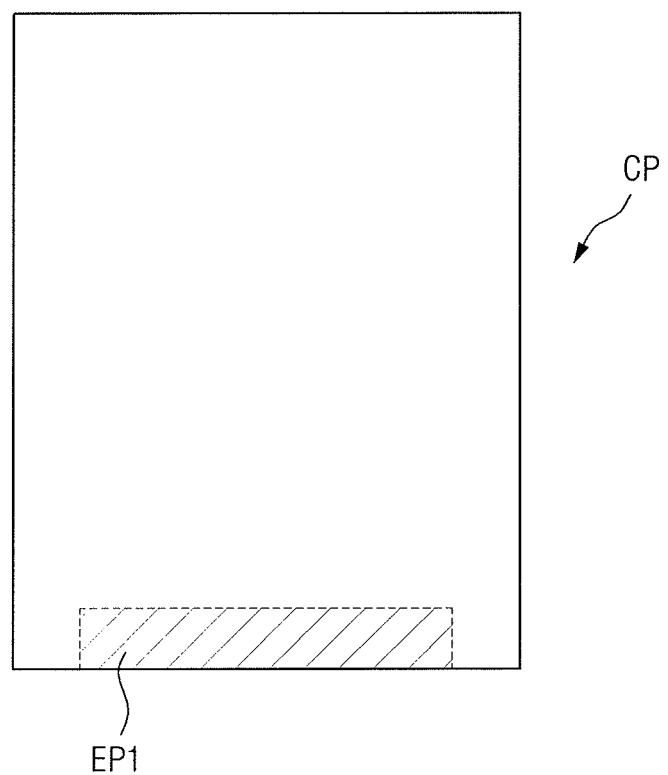
FIG. 6 illustrates a layout view of a display device according to another exemplary embodiment of the present disclosure.

FIG. 6 illustrates a layout view of a display device according to another exemplary embodiment of the present disclosure.

Referring to FIG. 6, an elastic pattern EP1 may be formed along a part of a short side of a cover panel CP.

FIG. 6 illustrates the elastic pattern EP1 as being formed along a part of a short side of the cover panel CP.

In an implementation, the elastic pattern EP1 may be disposed along a middle or central part of a short side of the cover panel CP (e.g., spaced apart from the long sides).

As mentioned above with reference to FIG. 5, by pressing a part of the display device according to the present exemplary embodiment where the elastic pattern EP1 is formed, the detachment of the cover panel CP may be initiated at the location where the elastic pattern EP1 is disposed.

Figure 7:
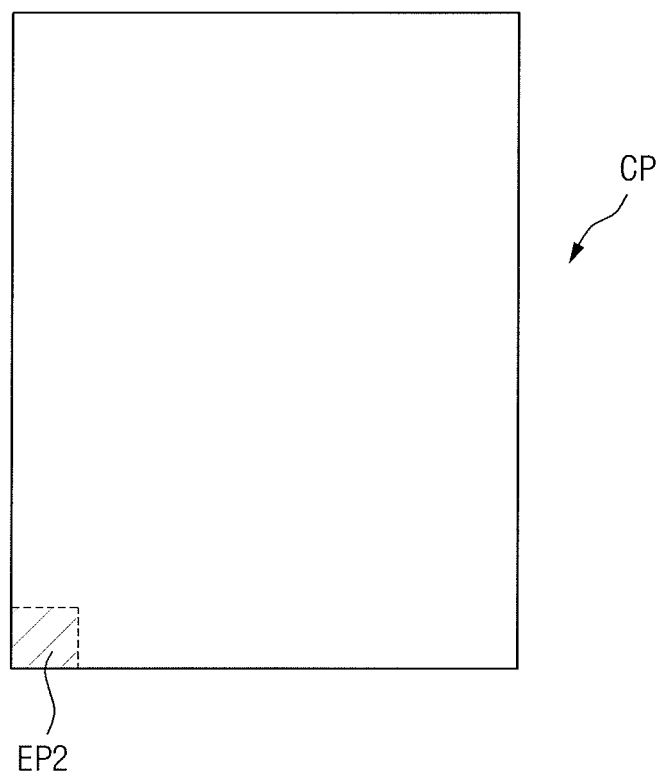
FIG. 7 illustrates a layout view of a display device according to another exemplary embodiment of the present disclosure.

FIG. 7 illustrates a layout view of a display device according to another exemplary embodiment of the present disclosure.

Referring to FIG. 7, in the present exemplary embodiment, unlike in the exemplary embodiment of FIG. 1, an elastic pattern EP2 may be formed only at a corner of a cover panel CP.

For example, the elastic pattern EP2 may be formed at one (or more) of the four corners of the cover panel CP.

The corners of the cover panel CP may be defined as parts between the long sides and the short sides of the cover panel CP (e.g., where the short sides and the long sides meet). For example, the corners of the cover panel CP may be defined as parts connecting the long sides and the short sides of the cover panel CP.

The detachment of the panel PA and the cover panel CP may begin at the corner or corners of the cover panel CP.

In an implementation, as illustrated in FIG. 7, the elastic pattern EP may be formed at one of the four corners of the cover panel CP, or two or more elastic patterns EP2 may be formed at two or more of the four corners of the cover panel CP.

Figure 8:
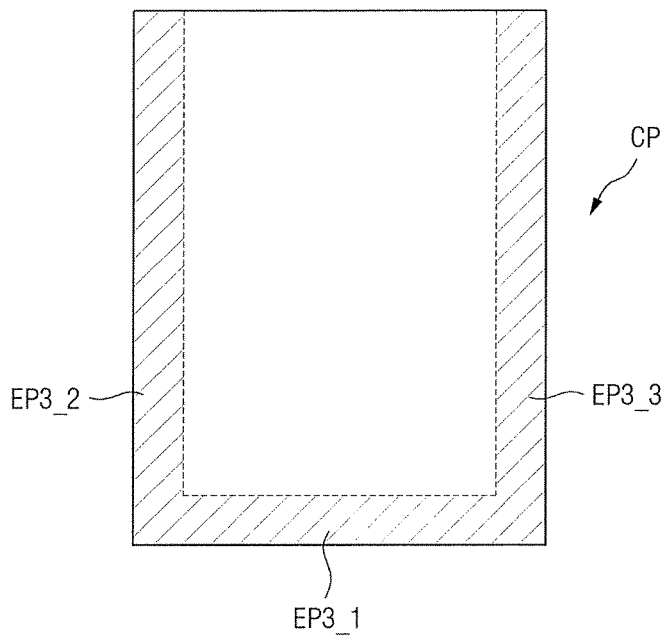
FIG. 8 illustrates a layout view of a display device according to another exemplary embodiment of the present disclosure.

FIG. 8 illustrates a layout view of a display device according to another exemplary embodiment of the present disclosure. Referring to FIG. 8, an elastic pattern EP3 may be formed to extend along three sides of a cover panel CP.

For example, the elastic pattern EP3 may include a first elastic pattern EP3_1, which is formed along a short side of the cover panel CP, and second and third elastic patterns EP3_2 and EP3_3, which are disposed along the long sides with the first elastic pattern EP3_1 interposed therebetween (e.g., between ends thereof).

For example, the first, second, and third elastic patterns EP3_1, EP3_2, and EP3_3 may extend along the outer circumference of the cover panel CP.

In an implementation, as illustrated in FIG. 8, the first, second, and third elastic patterns EP3_1, EP3_2, and EP3_3 may extend continuously one after another, or the first, second, and third elastic patterns EP3_1, EP3_2, and EP3_3 may be formed to extend intermittently or discontinuously.

In an implementation, the elastic pattern may be omitted on the side of a panel PA opposite to the first elastic pattern EP3_1 so as to not affect signal lines or a circuit board on the corresponding side of the panel PA.

Figure 9:
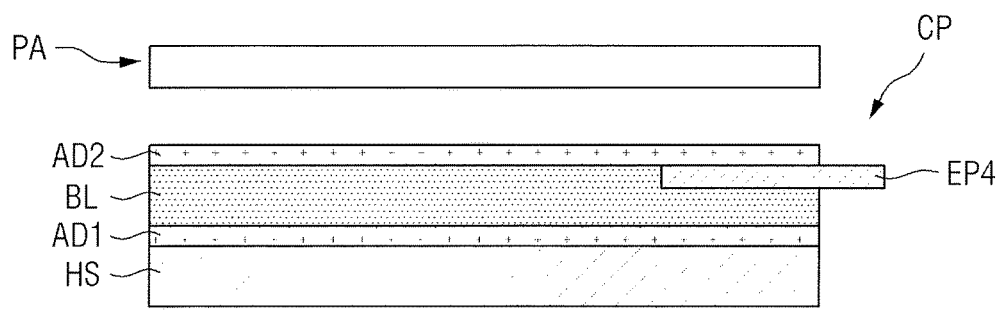
FIG. 9 illustrates a cross-sectional view of a display device according to another exemplary embodiment of the present disclosure.

FIG. 9 illustrates a cross-sectional view of a display device according to another exemplary embodiment of the present disclosure.

Referring to FIG. 9, in the present exemplary embodiment, unlike in the exemplary embodiment of FIG. 1, an elastic pattern EP4 may extend beyond an impact absorbing layer BL.

For example, the elastic pattern EP4 may extend such that an end or portion of the elastic pattern EP4 is outside the impact absorbing layer BL. For example, a part of the elastic pattern EP4 may protrude from or beyond a side of the impact absorbing layer BL.

In a case in which the elastic pattern EP4 is formed to at least partially protrude, a handle may be provided to or for peeling equipment. For example, the peeling equipment may separate the panel PA and the cover panel CP by holding the elastic pattern EP4, and may thus prevent the panel PA from being impacted.

The difference between the elastic pattern EP of FIG. 4 and the elastic pattern EP4 of FIG. 9 is that the elastic pattern EP4 may protrude even in the absence of pressure applied thereto, whereas the elastic pattern EP protrudes only in the presence of or in response to pressure applied thereto.

The elastic pattern EP4 may protrude even in the absence of pressure applied thereto, as illustrated in FIG. 9, the panel PA and the cover panel CP may be separated from each other while reducing the pressure applied to the display device according to the present exemplary embodiment, and as a result, the reusability of the panel PA may be further improved.

Figure 10:
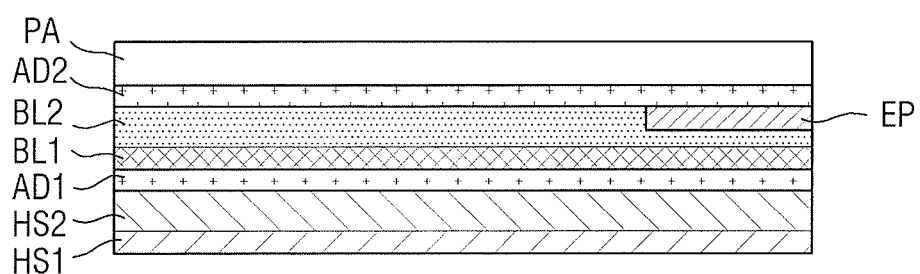
FIG. 10 illustrates a cross-sectional view of a display device according to another exemplary embodiment of the present disclosure.

FIG. 10 illustrates a cross-sectional view of a display device according to another exemplary embodiment of the present disclosure.

Referring to FIG. 10, in the present exemplary embodiment, unlike in the exemplary embodiment of FIG. 1, the heat sink layer may include a first heat sink layer HS1 and a second heat sink layer HS2, which are sequentially stacked, and the impact absorbing layer may include a first impact absorbing layer BL1 and a second impact absorbing layer BL2.

In an implementation, the heat sink layer and/or the impact absorbing layer may have a stack structure in which two or more functional layers are stacked.

For example, the heat sink layer may include the first and second heat sink layers HS1 and HS2.

In an implementation, the first heat sink layer HS1 may include, e.g., a metal. For example, the metal may be copper (Cu).

In an implementation, the second heat sink layer HS2 may include, e.g., graphite.

In an implementation, the impact absorbing layer may include the first and second impact absorbing layers BL1 and BL2.

For example, the first impact absorbing layer BL1 may employ or include a material for absorbing impact, and the second impact absorbing layer BL2 may employ or have a structure for absorbing impact.

For example, the first impact absorbing layer BL1 may be formed of an elastic material, and the second impact absorbing layer BL2 may have an embossed structure. For example, the second impact absorbing layer BL2 may have an uneven structure formed on one or both surfaces thereof.

For example, an elastic pattern EP may be formed on one side of the second impact absorbing layer BL2. In an implementation, the elastic pattern EP may be formed on one side of the second impact absorbing layer BL2 in contact with the second impact absorbing layer BL2.

A second adhesive layer AD2 may be disposed on the elastic pattern EP and the second impact absorbing layer BL2. For example, the elastic pattern EP and the second impact absorbing layer BL2 may contact the second adhesive layer AD2.

The second adhesive layer AD2 and the panel PA may be substantially the same as their respective counterparts of FIG. 1, and thus, detailed descriptions thereof may be omitted.

Figure 11:
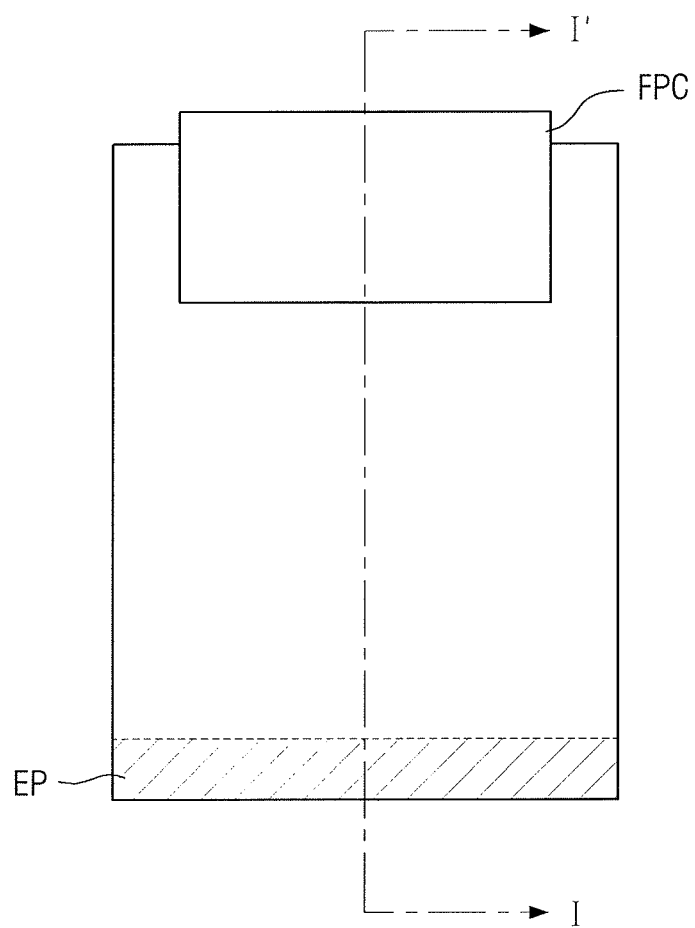
FIG. 11 illustrates a layout view of a display device according to an exemplary embodiment of the present disclosure.
Figure 12:
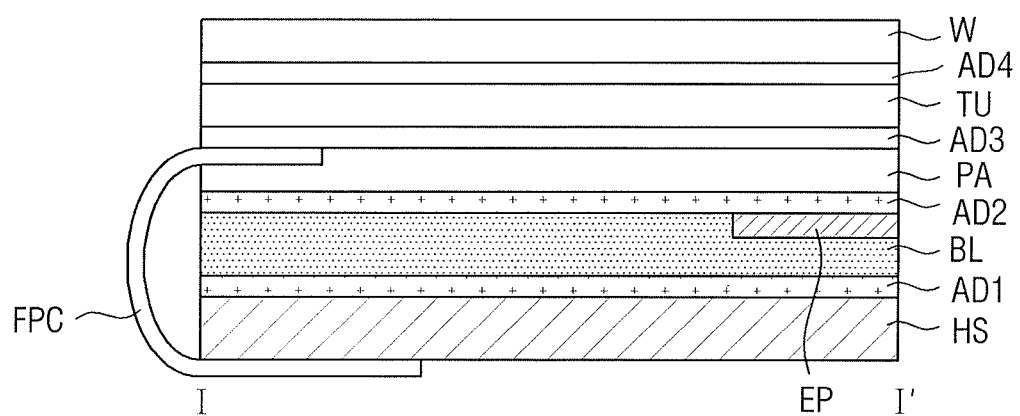
FIG. 12 illustrates a cross-sectional view taken along line I-I' of FIG. 11.

FIG. 11 illustrates a layout view of a display device according to an exemplary embodiment of the present disclosure. FIG. 12 illustrates a cross-sectional view taken along line I-I' of FIG. 11.

Referring to FIGS. 11 and 12, the display device according to the present exemplary embodiment may further include a circuit board FPC on one side of a panel PA, a touch unit TU on the panel PA, and a window W on the touch unit TU.

The circuit board FPC may be on a side of the panel PA opposite to an elastic pattern EP. For example, the circuit board FPC may be a flexible printed circuit board (FPCB).

Various electronic devices may be mounted on the circuit board FPC and may transmit signals for driving the panel PA to the panel PA.

For example, the circuit board FPC extend from the panel PA. In an implementation, an end of the circuit board FPC may be at least partially bent to face a bottom surface of a heat sink HS. In an implementation, the panel PA may be bent such that the end of the circuit board FPC faces the bottom surface of the heat sink HS.

In an implementation, the end of the circuit board FPC may be placed in contact with the bottom surface of the heat sink HS, or one or more functional layers may be interposed between the end of the circuit board FPC and the heat sink HS.

For example, a cover panel CP may be disposed between one end and the other end of the circuit board FPC.

A third adhesive layer AD3 may be disposed on the panel PA. The third adhesive layer AD3 may include a photo-curing resin or a thermosetting resin having a high transmittance and having adhesive performance. For example, the third adhesive layer AD3 may be formed by applying a resin such as an acrylic resin and irradiating UV light to cure the resin.

For example, the third adhesive layer AD3 may include a PSA.

In an implementation, the third adhesive layer AD3 may include an OCA.

In an implementation, the third adhesive layer AD3 may have a thickness of 5 µm to 200 µm.

The touch unit TU may be on the third adhesive layer AD3. The touch unit TU may facilitate entry of touch input. For example, the touch unit TU may be a touch panel or touch screen panel TSP.

In an implementation, as illustrated in FIG. 12, the touch unit TU may completely overlap the panel PA, or the touch unit TU may be smaller in size than the panel PA.

In an implementation, the separate touch unit TU may be omitted. For example, the touch unit TU may be formed in one integral body with the panel PA.

A fourth adhesive layer AD4 may be disposed on the touch unit TU. The fourth adhesive layer AD4 may include a photo-curing resin or a thermosetting resin having a high transmittance and having adhesive performance. For example, the fourth adhesive layer AD4 may be formed by applying a resin such as an acrylic resin and irradiating UV light to cure the resin.

For example, the fourth adhesive layer AD4 may include a PSA.

In an implementation, the fourth adhesive layer AD4 may include an OCA.

For example, the fourth adhesive layer AD4 may have a thickness of 5 μm to 200 μm.

The window W may be on the fourth adhesive layer AD4. The window W may include transparent glass or plastic. For example, the window W may be formed of a light-transmissive material.

In an implementation, the window W may have flexibility. For example, the window W may include or have a bendable, foldable, or rollable material or structure.

By way of summation and review, the fabrication of a display device may include numerous steps, and defects could occur during any of the steps. If defects were to occur in the process of fabricating a display device, some parts may need to be discarded, or some parts may be still sufficiently reusable. Even the reusable parts, however, may not be able to be reused because they are so closely attached to or assembled with other parts that they cannot be easily separated. Increasing the reusability of parts and elements may contribute to lowering the manufacturing cost of a display device.

The embodiments may provide a cover panel capable of being easily separated from a panel and increasing the reusability of parts and elements.

The embodiments may provide a display device capable of facilitating the separation of a panel and a cover panel and increasing the reusability of parts and elements.

According to the aforementioned and other exemplary embodiments, the separation of a cover panel and a panel can be facilitated, and as a result, impact applied to the panel during the separation of the cover panel and the panel can be alleviated.

By alleviating the impact applied to the panel, the panel can be prevented from being broken during the separation of the cover panel and the panel.

Accordingly, the reusability of the panel may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A cover panel, comprising:
a heat sink layer;
an impact absorbing layer on the heat sink layer; and
an elastic pattern on at least one side of the impact absorbing layer.

2. The cover panel as claimed in claim 1, wherein the elastic pattern includes a urethane, a rubber, or a synthetic resin.

3. The cover panel as claimed in claim 1, wherein the elastic pattern has a higher level of elasticity than the impact absorbing layer.

4. The cover panel as claimed in claim 1, further comprising an adhesive layer on the elastic pattern and the impact absorbing layer.

5. The cover panel as claimed in claim 1, wherein a sidewall of the elastic pattern is aligned with a sidewall of the impact absorbing layer.

6. The cover panel as claimed in claim 1, wherein the elastic pattern at least partially protrudes beyond an edge of the impact absorbing layer in response to pressure being applied to the elastic pattern.

7. The cover panel as claimed in claim 1, wherein the cover panel has:
two long sides opposite to each other, and
short sides between the two long sides.

8. The cover panel as claimed in claim 7, wherein the elastic pattern extends along one of the short sides.

9. The cover panel as claimed in claim 7, wherein:
the cover panel has corners where the long sides and the short sides meet, and
the elastic pattern is at one of the corners.

10. The cover panel as claimed in claim 1, wherein an end of the elastic pattern is beyond an outer edge of the impact absorbing layer.

11. A display device, comprising:
a cover panel; and
a display panel on the cover panel,
wherein the cover panel includes a heat sink layer, an impact absorbing layer on the heat sink layer, and an elastic pattern on at least one side of the impact absorbing layer.

12. The display device as claimed in claim 11, wherein the elastic pattern includes a urethane, a rubber, or a synthetic resin.

13. The display device as claimed in claim 12, wherein the elastic pattern has a higher level of elasticity than the impact absorbing layer.

14. The display device as claimed in claim 12, wherein a sidewall of the elastic pattern is aligned with a sidewall of the impact absorbing layer.

15. The display device as claimed in claim 12, wherein the elastic pattern at least partially protrudes beyond an edge of the impact absorbing layer in response to pressure being applied to the elastic pattern.

16. The display device as claimed in claim 12, wherein the cover panel has:
two long sides opposite to each other, and;
short sides between the two long sides.

17. The display device as claimed in claim 16, wherein the elastic pattern extends along one of the short sides.

18. The display device as claimed in claim 17, wherein the cover panel has corners where the long sides and the short sides meet, and
the elastic pattern is at one of the corners.

19. The display device as claimed in claim 12, wherein an end of the elastic pattern is beyond an outer edge of the impact absorbing layer.

20. The display device as claimed in claim 12, further comprising:
a touch unit on the display panel; and
a window on the touch unit.

* * * * *